United States Patent
Zipprich-Rasch

(10) Patent No.: US 7,403,438 B2
(45) Date of Patent: Jul. 22, 2008

(54) MEMORY ARRAY ARCHITECTURE AND METHOD FOR HIGH-SPEED DISTRIBUTION MEASUREMENTS

(75) Inventor: Volker Zipprich-Rasch, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 197 days.

(21) Appl. No.: 11/485,185

(22) Filed: Jul. 12, 2006

(65) Prior Publication Data

US 2008/0013390 A1    Jan. 17, 2008

(51) Int. Cl.
*G11C 7/00*    (2006.01)
(52) U.S. Cl. .............. 365/201; 365/189.12; 365/189.07
(58) Field of Classification Search .................. 365/201, 365/189.12, 189.07
See application file for complete search history.

(56) References Cited

U.S. PATENT DOCUMENTS

| | | | |
|---|---|---|---|
| 5,309,446 A * | 5/1994 | Cline et al. ................. | 714/718 |
| 5,600,593 A * | 2/1997 | Fong ...................... | 365/185.19 |
| 6,226,200 B1 | 5/2001 | Eguchi et al. | |
| 6,646,920 B2 * | 11/2003 | Takashina et al. ...... | 365/185.22 |
| 7,317,638 B2 * | 1/2008 | Guterman et al. ...... | 365/185.22 |
| 2007/0291545 A1 * | 12/2007 | Mokhlesi ............... | 365/185.22 |

* cited by examiner

*Primary Examiner*—Tuan T Nguyen
(74) *Attorney, Agent, or Firm*—Slater & Matsil, L.L.P.

(57) ABSTRACT

A method includes an initial process of selecting a memory cell within the memory array and an operating condition under which the memory cell is to be tested. The memory cell is tested under the specified operating condition, and a measured response obtained therefrom. Based upon the measured response, a determination is made as to whether the memory cell passes or fails a predetermined criterion. The pass/fail result is communicated to a counter that is integrated on-chip with the memory array, the counter operable to accumulate a total number of pass or fail results supplied thereto. The aforementioned processes are repeated for at least one different memory cell, whereby the new memory cell is tested under the aforementioned operating conditions. Subsequently, a data value representing the accumulated number of pass or fail results is output from the on-chip counter.

20 Claims, 3 Drawing Sheets

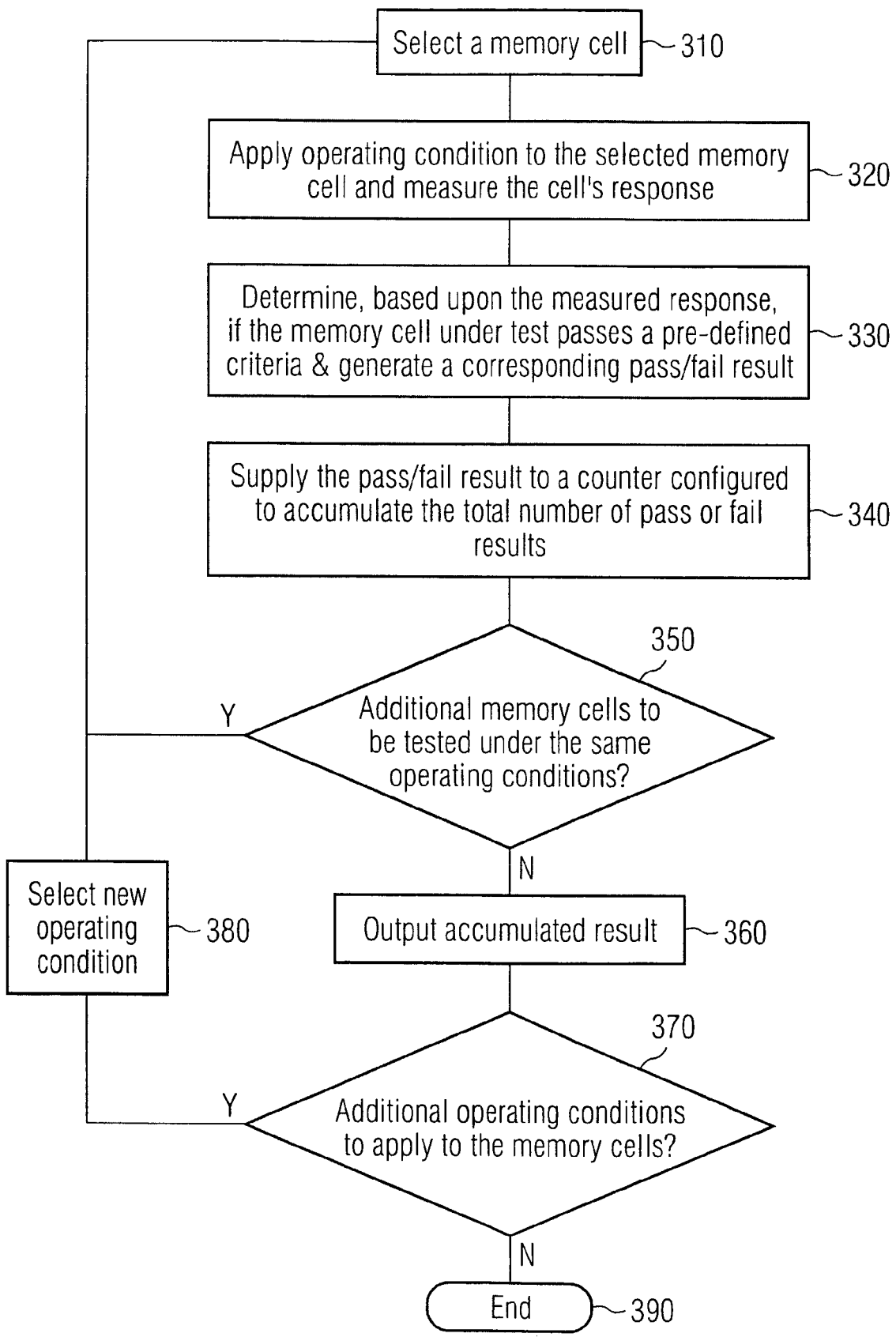

MEMORY ARRAY ARCHITECTURE AND METHOD FOR HIGH-SPEED DISTRIBUTION MEASUREMENTS

TECHNICAL FIELD

The present invention relates to memory devices, and more particularly to an integrated memory array architecture and method for performing high-speed distribution measurements.

BACKGROUND

What is needed is a new memory array architecture and method for performing distribution measurements at high speeds and with little instrumentation.

SUMMARY OF THE INVENTION

The present invention provides an integrated memory array architecture and method for performing high speed distribution measurement therewith. The method includes an initial process of selecting a memory cell within the memory array and an operating condition under which the memory cell is to be tested. The memory cell is tested under the specified operating condition, and a measured response obtained therefrom. Based upon the measured response, a determination is made as to whether the memory cell passes or fails a predetermined criterion. The pass/fail result is communicated to a counter that is integrated on-chip with the memory array, the counter operable to accumulate a total number of pass or fail results supplied thereto. The aforementioned processes are repeated for at least one different memory cell, whereby the new memory cell is tested under the aforementioned operating conditions. Subsequently, a data value representing the accumulated number of pass or fail results is output from the on-chip counter.

These and other features of the invention will be better understood when taken in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 illustrates a method for performing high speed distribution measurements in accordance with one embodiment of the present invention.

Figure 1A:
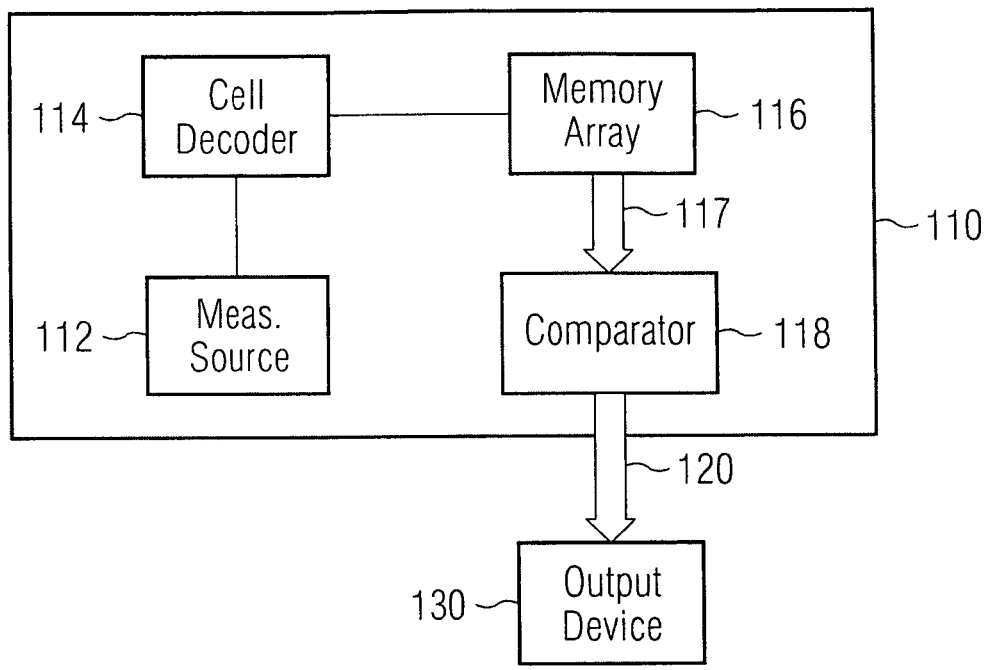
FIG. 1A illustrates a system for performing distribution measurements of a memory array.

For clarity, previously defined features retain their reference numerals in subsequent drawings.

DETAILED DESCRIPTION OF ILLUSTRATIVE EMBODIMENTS

Within the fields of memory device fabrication and testing, distribution measurements are widely used to study the performance and operation of memory cells within the array. Distribution measurements provide a clear and concise picture of the array's collective performance for a chosen parameter, for example the threshold voltage of memory cells at or above which the previously-programmed or erased memory cell becomes conductive. Such array-wide information can be used to determine whether the array passes or fails a particular global criterion, or be used to inform those manufacturing the array of potential problems or trends with the current fabrication process.

FIG. 1A illustrates a system for performing distribution measurements of a memory array. The system 110 includes a measurement source 112, cell decoder 114, memory cell array 116, and comparators 118. During testing, instructions to select a particular memory cell within the array 116 are provided to the cell decoder 114. The cell decoder 114, which, in a typical embodiment consists of wordline and bitline decoders, operate to activate the desired memory cell.

The measurement source 112 supplies a particular operating (biasing) condition to the cell decoder 114, which is applied to the selected memory cell in the array 116. The operating condition may vary depending upon the type of distribution parameter sought. For example, when the mapping of the array's threshold voltage distribution is sought, the operating conditions may consist of forward biasing the selected memory cell FET and applying a particular gate voltage to the cell wordline to determine whether the memory cell FET becomes conductive. Conduction of the cell is expected at a particular threshold voltage, depending upon whether the cell is in an erased or programmed state.

The predefined operating conditions are applied to the memory cell, and its response thereto is supplied over an internal bus 117 to a corresponding comparator included within the comparator bank 118. Each comparator (typically implemented as a sense amplifier) is operable to compare its respective memory cell output with a predefined criterion, although only the selected memory cell will provide the measured response of interest, as the non-selected memory cells are disabled. In an exemplary embodiment carried forward herein, the memory cell response consists of the conduction/non-conduction state for the memory cell under test, and the predefined criterion is a conduction state. A pass result is indicated when a conduction state is sensed at the supplied $V_t$ level and a fail result is indicated when the applied $V_t$ voltage does not result in the activation of the memory cell's conduction state.

Figure 1B:
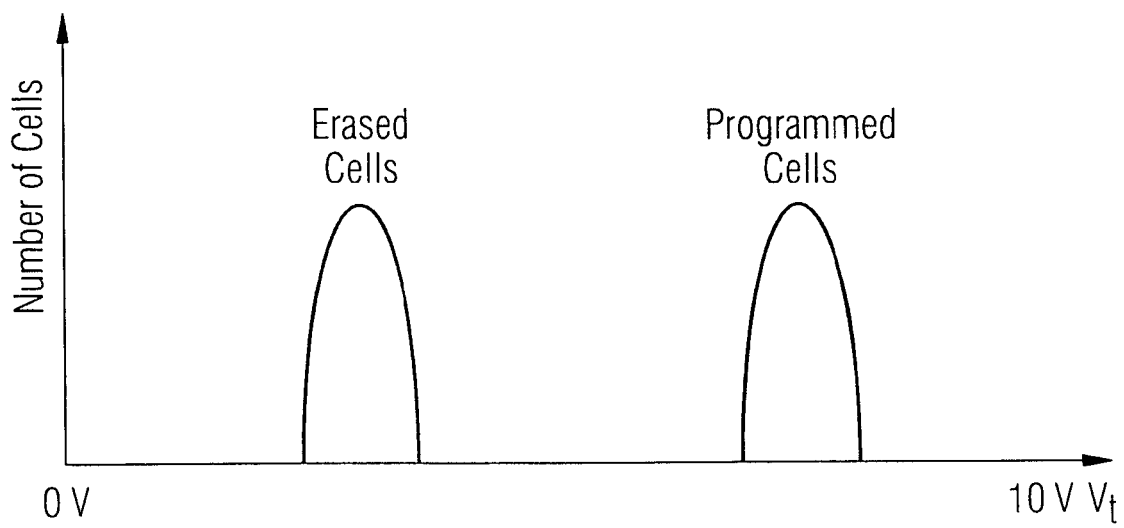
FIG. 1B illustrates a distribution measurement for erased and programmed memory cells as a function of the cells threshold voltages $V_t$.

The pass/fail result of each comparator is subsequently communicated to an output device 130 via bus 120. The output device stores the pass result to later accumulate it with additional pass results obtained from other memory cells tested under the same operating conditions. Next, the tested memory cell is disabled and a new memory cell is selected, the aforementioned operating conditions applied thereto to test for conduction. A pass or fail result is detected, communicated to the output device where it is stored, and another memory cell is selected. The process continues until all memory cells have been tested at the particular operating condition, at which time the output device accumulates all of the pass results at the particular operating point and outputs that total number on the output device. The process is then repeated for the next operating condition. In this way, each memory cell within the array 116 is selected and tested at the same operating condition, its response compared to a predefined criterion, and the resulting pass or failure of such a response output one memory cell-by-one memory cell to the output device 130. FIG. 1B illustrates a typical distribution measurement for memory cells in erased and programmed states as a function of the cells' threshold voltages $V_t$.

The conventional structure and methodology suffers from several disadvantages, an important one being the limited speed with which distribution measurements can be made across the array. Specifically, the conventional testing structure and process for selecting, activating, measuring, and mapping the pass/fail response of each memory cell, one-by-one, is very time consuming. In addition, the conventional testing approach requires a massively parallel connection between the comparator 118 and the output device 130, consisting of one connection per sense amplifier output in a typical test set-up. Because the size of memory arrays are larger than the bus structures that can connect to them, the conventional approach in some instances dictates either partial testing of the array and reconnection to test the other connection points, or the use of multiple test beds to perform a complete array-wide distribution measurement.

Figure 2:
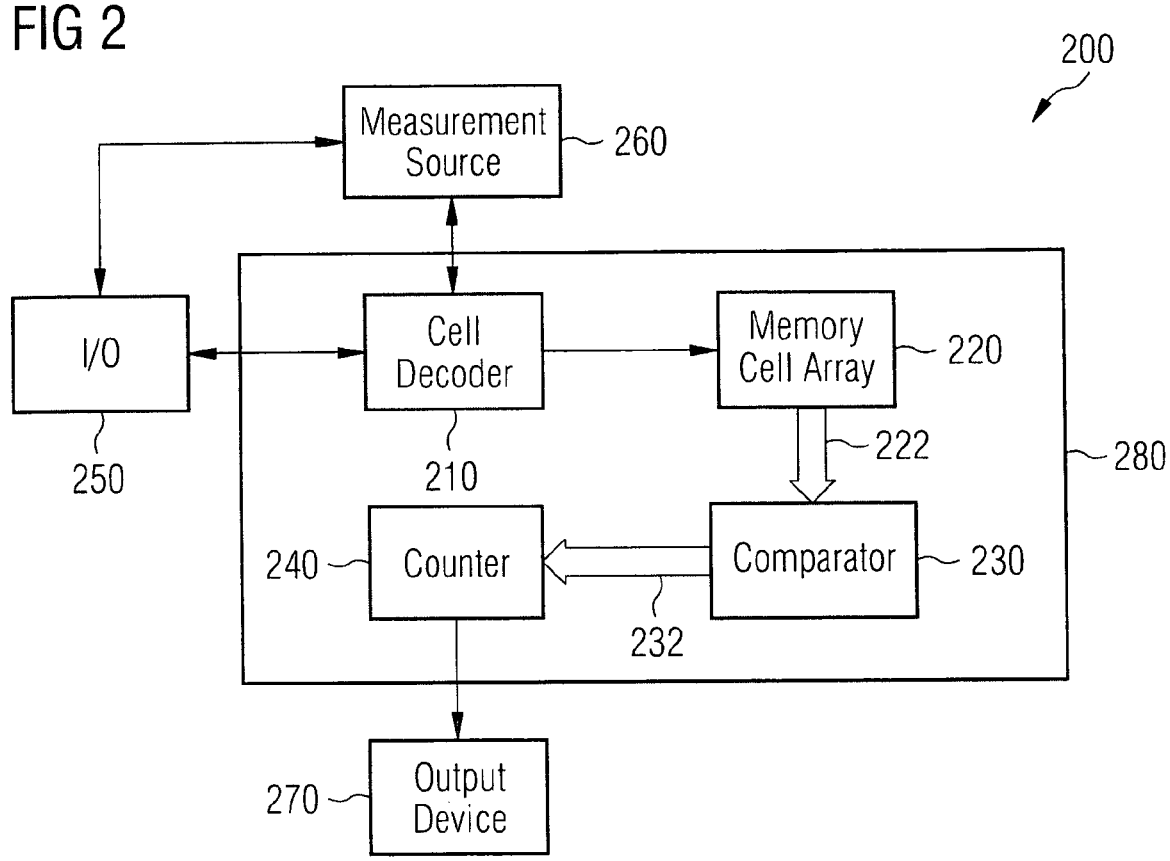
FIG. 2 illustrates a simplified block diagram of a system operable to perform high speed distribution measurements in accordance with one embodiment of the present invention.

FIG. 2 illustrates a simplified block diagram of an integrated memory device provided in accordance with one embodiment of the present invention. As shown, the device 200 includes a cell decoder 210, memory cell array 220, a comparator bank 230, and a counter 240.

The cell decoder 210 (wordline and bitline decoders in a specific embodiment) is operable to select the particular memory cell within array 220 that is to be tested and to provide a particular operating condition (e.g., biasing, etc.) thereto. An I/O device (e.g., a computer) 250 may be additionally used to program the cell decoder to select a particular memory cell and to control a measurement source 260 for providing the proper power settings to the memory cell. Once the desired memory cell is selected and the operating conditions applied, the memory cell produces a response that is communicated to the comparator 230 via an internal bus 222.

The operating conditions applied to the memory cell will correspond to the particular distribution parameter sought, which, in a specific embodiment is the characteristic threshold voltage $(V_t)$ of memory cells across the array. In this instance, the operating condition will involve applying a voltage to the control terminal of each memory cell. The operating conditions can be varied, for example 0.5 V-7.0 V for $V_t$ to obtain a distribution mapping of the memory cell array as a function of the applied voltage. As those skilled in the art will appreciate, the distribution parameter may include other parameters as well, for example, drain-to-source current $I_{DS}$ of the memory cell FET. In an alternative embodiment of the invention, any parameter may be used that has a measureable, in other words, detectable, influence on the distribution.

The integrated memory device 200 further includes the memory array 220, which may be of the volatile and/or non-volatile type. In a particular embodiment, each memory cell is a floating gate field effect transistor typically implemented in a non-volatile memory such as an electrically-erasable programmable read only memory (EEPROM). In a further embodiment of the invention, each memory cell is charge-trapping field effect transistor, e.g., a nitrided read only memory (NROM) field effect transistor also typically implemented in a non-volatile memory such as an electrically-erasable programmable read only memory (EEPROM). Moreover, it should be noted that other devices may comprise the memory cell in alternative embodiments. In one embodiment of the invention, any type of memory cell may be used, in which the threshold voltage of the respective memory cell is changed. In one embodiment of the invention, a Phase Change Memory (PCM) or a Conductive Bridging Random Access Memory (CBRAM) may be used.

The integrated memory device 200 also includes a comparator bank 230 and counter 240. In an exemplary embodiment the comparator bank 230 comprises sense amplifiers, each having a first port coupled to a respective one of the memory cells and a second port coupled to receive a reference signal. Each comparator is operable to compare the measured response of its respective memory cell with a predefined criterion, and based thereon, generates a pass/fail signal that is communicated to the counter 240 along an internal bus 232. During testing, only the pass/fail signal corresponding to the selected memory cell is of interest, as the comparators coupled to the non-selected memory cells are disabled. In the foregoing exemplary embodiment in which mapping of memory cell threshold voltage is sought, the measured response comprises an indication of transistor conduction, e.g., the flow of current from the drain to the source terminal, or reduction in the drain-to-source resistance. In such an instance, a measured response such as the magnitude of the conduction current or $R_{ds}$ is compared against corresponding baseline values to determine whether the cell is in a conductive state, and a corresponding pass/fail signal is generated. As noted above, other memory cell responses may be alternatively used to determine the memory cell's operation with respect to other distribution parameters.

The pass/fail signal generated by the comparator may be formatted in terms of a digital signal that is in a first state when the measured distribution parameter passes the comparison (e.g., a logical "1"), or a second state when the measured distribution parameter fails the comparison. Alternatively, the pass/fail signal may be a single state signal when the condition corresponding to that state (e.g., pass or fail) is detected by the comparator 230.

The counter 240 receives the pass/fail signal, and based thereon accumulates the pass/fail result with a previously accumulated result (if any), thereby storing a running count of the number of passed/failed memory cells. The content of the counter 240 can then be supplied to an output device 270, such as a printer, computer, or some such similar device for rendering the accumulated pass/fail count. In one embodiment of the invention, the output device 270 is a part of a testing device. In one embodiment of the invention, the testing device also includes the I/O device 250 and/or the measurement source 260, wherein the connection from the counter 240 to the output device 270 and to the I/O device 250 may be integrated into one common interface, e.g., a common I/O interface.

In a particular embodiment, counter 240 accumulates the collective number of memory cell passes by incrementing its count upon receiving a pass result. Alternatively, the counter may be operable to count down or decrement from a pre-programmed number of total memory cells in the array upon receiving a fail result. As can be understood, the process of communicating a data value representative of the total number of passes or failures to an output device is much more time efficient and requires much less parallel connectivity compared to the conventional testing approach.

In one embodiment of the invention, the counter 240 comprises a single register, which may include, for example, 20-40 bits for storing a value representing the accumulated count of passes/failures. In another embodiment, the counter 240 includes a plurality of different registers that may be included in a static random access memory device embedded within the integrated memory device. Such a counter architecture is useful in storing an accumulated count at different operating points, thereby obviating the need to output an accumulated count after the conclusion of each operating point measurement. In a further refinement of this embodiment, the data of the multi-register counter may be compressed or otherwise encoded in order to further facilitate communicating it to the output device 270.

FIG. 3 illustrates a method for performing high speed distribution measurements in accordance with one embodiment of the present invention. Initially at 310, a memory cell within the array is selected. This operation is performed in a particular embodiment using the cell decoder 210 and the I/O device 250, described above.

At 320, an operating condition is applied to the selected memory cell, and its response obtained. In the exemplary embodiment in which the threshold voltage $V_t$ of the array's memory cells is sought, the operating condition applied is the application of a selected gate voltage to determine if it is sufficient to render the memory cell FET conductive. As described above, the threshold voltage required to render the memory cell conductive will differ depending upon whether the memory cell is in an erased or programmed state. Further, those skilled in the art will appreciate that the particular distribution parameter sought will determine what operating conditions will be most appropriate for testing that condition, and that different operating conditions may be employed in the present invention to monitor a different distribution parameter.

In the exemplary embodiment, the measurement response involves the detection of a conduction state for the memory cell FET, conduction indicating that the applied gate voltage meets or exceeds the threshold voltage $V_t$. The operating conditions can be varied so as to test the threshold voltage of each memory cell over a range of voltages. As noted above, the distribution of other measurement parameters may be obtained in a similar way under alternative embodiments of the invention.

At 330, a determination is made as to whether the measured response passes or fails a predefined criterion, a corresponding pass or fail result being subsequently generated. Using the foregoing embodiment as an example, the criterion is the detection of drain-source current flow or other indication of the memory cell is operating in a conductive state. When the operating conditions are such that the applied threshold voltage is at or above the memory cell's threshold voltage, the memory cell will conduct and is deemed as having passed the criteria. Tested cells that do not exhibit conduction at the applied voltage level have a higher threshold voltage than the applied voltage and are deemed as failing the criteria. Of course, other criteria corresponding to a different distribution parameter may be tested in alternative embodiments as well. For example, a particular range of drain-to-source current may be selected as a distribution parameter, the predefined criteria for which may be set, for example, in a μA range, e.g., between about 1 μA to about 5 μA (in case of NROM cells as the memory cells), or in the nA range, e.g., between about 1 nA to about 5 nA (in case of floating gate cells as the memory cells). In such an instance, a current sensor or other such circuitry may be employed to monitor and determine pass or failure of such criteria.

At 340, the counter 240 is supplied with the pass/fail result and is operable to accumulate the total number of pass and/or fail results supplied thereto. As noted above, the pass/fail result may comprise a number of different formats. For example, in one embodiment the pass/fail result comprises only a pass result, such that fail results are not reported to the counter for accumulation. In another embodiment, the pass/fail result comprises only a fail result, such that pass results are not reported to the counter. In still a further embodiment, the pass/fail result includes either pass or failure information, and the counter is operable to accumulate a count on both the total number of cell passes and failures.

The process continues at 350, where a determination is made as to whether a subsequent test is to be made. In a specific embodiment of this process, a determination is made as to whether all memory cells in the array have been tested under the present operating conditions. If further memory cells remain to be tested under the present operating conditions, the process returns to 310, where a subsequent memory cell is selected and the present operating conditions applied thereto to obtain a measured response of the newly selected memory cell. If no memory cell remains to be tested at the present operating condition, the process continues at 360, whereby the counter 240 outputs a data value representing the accumulated number of memory cells passing and/or failing the distribution criteria at the particular operating condition.

Optionally at 370 a determination may be made as to whether any additional operating conditions remain to be tested. If so, the new operating condition is selected at 380 (e.g., an increased or decreased gate voltage to be applied to the next selected memory cell) and the process returns to 310, where the processes of 310-360 are repeated. If no additional operating conditions remain, the process concludes at 390. As noted above, the counter 240 may include multiple registers, each storing an accumulated pass/fail count for a different operating condition. In such an embodiment, the output process described in 360 may be delayed until after process completion of process 370 when all of the accumulated results are supplied to the output device 270.

As readily appreciated by those skilled in the art, the described processes 310-380 may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer or other such programmable device to carry out the intended functions.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. In an integrated memory device having a memory array coupled to a counter, a method for performing a distribution measurement across the memory array, the method comprising:
   (i) selecting a memory cell within the memory array;
   (ii) applying a first operating condition to the selected memory cell and measuring a response thereof;
   (iii) determining, based upon the measured response, whether the memory cell under the first operating condition passes or fails a predetermined criteria, and generating a corresponding pass or fail result;
   (iv) supplying the pass or fail result to the counter, the counter operable to accumulate a total number of pass or fail results;
   (v) repeating (i)-(iv) for at least one different memory cell; and (vi) controlling the counter to output a data value representing the accumulated number of pass or fail results.

2. The method of claim 1, wherein the memory cell comprises a field effect transistor having gate, drain and source terminals, and wherein selecting a memory cell comprises selecting a wordline coupled to the gate terminal of the memory cell and bitlines coupled to the drain and source terminals of the memory cell.

3. The method of claim 2, wherein applying the first operating condition comprises applying a predetermined voltage to the gate terminal of the memory cell.

4. The method of claim 1, wherein measuring the response comprises detecting if the selected memory cell is in a conductive state under the first operation condition.

5. The method of claim 1, wherein measuring the response comprises measuring a drain-to-source current conducted through the selected memory cell under the first operating condition.

6. The method of claim 1, further comprising:
determining if all memory cells to be tested have been tested under the first operating condition; and
if all of the memory cells to be tested have been tested under the first operating condition, repeating (i)-(v) for a plurality of memory cells under a second operating condition.

7. The method of claim 6, wherein:
the counter comprises a first register for accumulating the pass or fail results of a plurality of memory cells tested under the first operating condition, and a second register for accumulating the pass or fail results of a plurality of memory cells tested under the second operating condition;
supplying comprises supplying, to the first register, the pass or fail result of each memory cell tested under the first operating condition, and supplying, to the second register, the pass or fail result of each memory cell tested under the second operating condition; and
controlling comprises controlling the counter to output, from the first register, a data value representing the accumulated number of pass or fail results of the memory cells tested under the first operating condition, and controlling the counter to output, from the second register, a data value representing the accumulated number of pass or fail results of the memory cells tested under the second operating condition.

8. A computer program product, resident on a computer readable medium, operable to execute instructions for performing a distribution measurement across a memory array included within an integrated memory device, the memory array coupled to a counter within the integrated memory device, the computer program product comprising:
(i) instruction code to select a memory cell within the memory array;
(ii) instruction code to apply a first operating condition to the selected memory cell and measure a response thereof;
(iii) instruction code to determine, based upon the measured response, whether the memory cell under application of the first operating condition passes or fails a predetermined criteria, and generating a corresponding pass or fail result;
(iv) instruction code to supply the pass or fail result to the counter, the counter operable to accumulate a total number of pass or fail results;
(v) instruction code to repeat (i)-(iv) for at least one subsequent memory cell for testing under the first operating condition; and (vi) instruction code to control the counter to output a data value representing the accumulated number of pass or fail results.

9. The computer program product of claim 8, wherein the memory cell comprises a field effect transistor having gate, drain and source terminals, and wherein the instruction code to select a memory cell comprises instruction code to select a wordline coupled to the gate terminal of the memory cell and bitlines coupled to the drain and source terminals of the memory cell.

10. The computer program product of claim 9, wherein the instruction code to apply a first operating condition comprises instruction code to apply a predefined voltage to the gate terminal of the memory cell.

11. The computer program product of claim 8, wherein the instruction code to measure a response comprises instruction code to detect if the selected memory cell is in a conductive state under the first operation condition.

12. The computer program product of claim 8, wherein the instruction code to measure a response comprises instruction code to measure a drain-to-source current conducted through the selected memory cell under the first operating condition.

13. The computer program product of claim 8, further comprising:
instruction code to determine if all memory cells have been tested under the first operating condition; and
instruction code to repeat (i)-(v) for a plurality of memory cells under a second operating condition if all of the memory cells have been tested under the first operating condition.

14. The computer program product of claim 13, wherein:
the counter comprises a first register for accumulating the pass or fail results of a plurality of memory cells tested under the first operating condition, and a second register for accumulating the pass or fail results of a plurality of memory cells tested under the second operating condition;
the instruction code to supply comprises instruction code to supply, to the first register, the pass or fail result of each memory cell tested under the first operating condition, and instruction code to supply, to the second register, the pass or fail result of each memory cell tested under the second operating condition; and
the instruction code to control comprises instruction code to control the counter to output, from the first register, a data value representing the accumulated number of pass or fail results of the memory cells tested under the first operating condition, and instruction code to control the counter to output, from the second register, a data value representing the accumulated number of pass or fail results of the memory cells tested under the second operating condition.

15. An integrated memory device, comprising:
a memory array comprising a plurality of memory cells;
a cell decoder coupled to each of the memory cells and operable to selectively provide a predefined operating condition to each of the memory cells;
a plurality of comparators, each comparator having a first input coupled to a respective memory cell, a second input coupled to receive a predefined criteria, and an output, wherein each comparator is operable to compare the output of the respective memory cell to the predefined criteria, and based thereon, produce a pass/fail result; and
a counter coupled to receive the pass/fail result, the counter operable to accumulate a plurality of pass/fail results into a total number of pass/fail results and to generate a data value representative of said total number of pass/fail results.

16. The integrated memory device of claim 15, wherein the memory array comprises a non-volatile memory array.

17. The integrated memory device of claim 15, wherein the memory array comprises a volatile memory array.

18. The integrated memory device of claim 15, wherein the counter comprises a 20-40 bit register.

19. The integrated memory device of claim 15, wherein the counter comprises a plurality of registers, each of the registers operable to accumulate a plurality of pass/fail results for a particular operating condition under which a plurality of memory cells is tested, each of the registers further operable to generate a data value representative of said accumulated number of pass/fail results.

20. The integrated memory device of claim 19, wherein the plurality of registers are stored in a static random access memory device included within said integrated memory device.

* * * * *